United States Patent [19]

Curtiss et al.

[11] Patent Number: 4,469,997
[45] Date of Patent: Sep. 4, 1984

[54] SELF GENERATIVE PWM VOLTAGE SOURCE INVERTER INDUCTION MOTOR DRIVE

[75] Inventors: William P. Curtiss, Winthrop; Gordon P. Sharp, Newton, both of Mass.

[73] Assignee: IMEC Corporation, Boston, Mass.

[21] Appl. No.: 433,012

[22] Filed: Oct. 6, 1982

Related U.S. Application Data

[63] Continuation-in-part of Ser. No. 262,742, May 11, 1981, Pat. No. 4,400,655.

[51] Int. Cl.³ ............................................. H02P 5/40
[52] U.S. Cl. .................................. 318/729; 318/805; 318/809
[58] Field of Search ................. 318/811, 803, 807–810

[56] References Cited

U.S. PATENT DOCUMENTS

| | | | |
|---|---|---|---|
| 3,909,687 | 9/1975 | Abbondanti | 318/805 |
| 4,001,660 | 1/1977 | Lipo | 318/802 |
| 4,249,120 | 12/1981 | Earle | 318/729 |
| 4,364,109 | 12/1982 | Okado et al. | 318/811 |
| 4,377,779 | 3/1983 | Plunkett | 318/811 |
| 4,400,655 | 8/1983 | Curtiss et al. | 318/729 |

Primary Examiner—David Smith, Jr.
Attorney, Agent, or Firm—Barry E. Sammons

[57] ABSTRACT

A PWM, controlled current, voltage source inverter controls an induction motor in response to signals from a power factor control circuit. The power factor control circuit receives signals related to motor terminal voltages and multiplexes them to a comparator. The inverter and multiplexer are sequenced each time the comparator input reaches a reference level. The frequency of the inverter is thus self generated. The power factor of the system can be controlled to implement a variety of control strategies.

14 Claims, 8 Drawing Figures

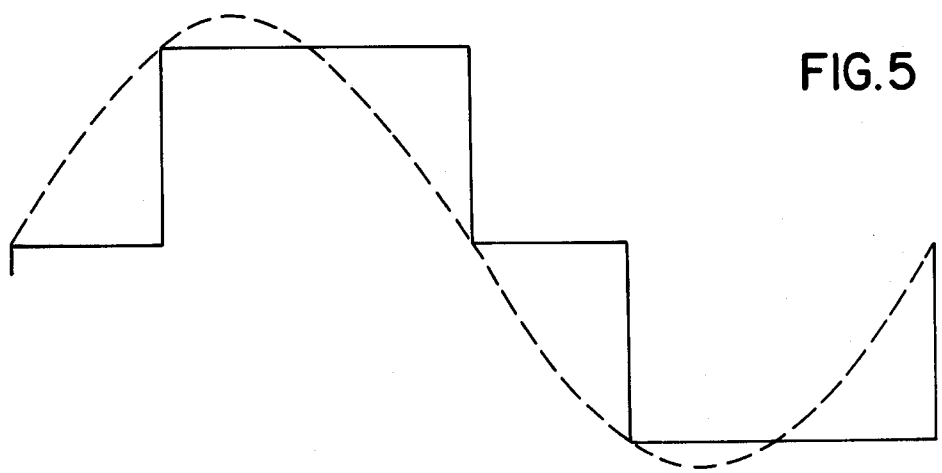
FIG.5
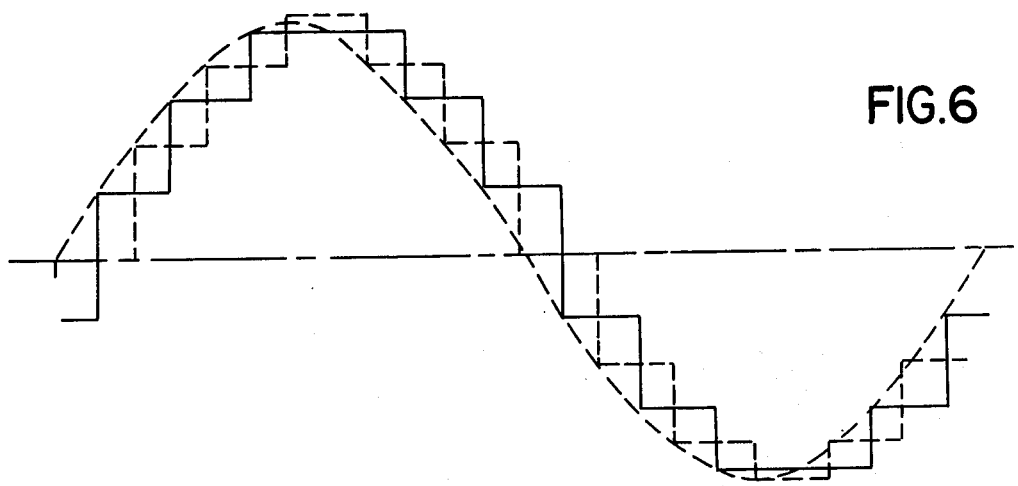
FIG.6
FIG.7
| SEQUENTIAL TABLE | S1 | S2 | S3 | S4 | S5 | S6 | S7 | S8 | S9 | S10 |
|---|---|---|---|---|---|---|---|---|---|---|
| n1 | 1 | 0 | 0 | 0 | 0 | 1 | 1 | 0 | 0 | 1 |
| n2 | 0 | 1 | 0 | 0 | 0 | 1 | 1 | 0 | 0 | 1 |
| n3 | 0 | 0 | 1 | 0 | 1 | 0 | 1 | 0 | 0 | 1 |
| n4 | 0 | 0 | 1 | 1 | 0 | 0 | 1 | 0 | 0 | 1 |
| n5 | 0 | 1 | 0 | 1 | 0 | 0 | 1 | 0 | 1 | 0 |
| n6 | 1 | 0 | 0 | 0 | 1 | 0 | 1 | 0 | 1 | 0 |
| n7 | 1 | 0 | 0 | 0 | 0 | 1 | 0 | 1 | 1 | 0 |
| n8 | 0 | 1 | 0 | 0 | 0 | 1 | 0 | 1 | 1 | 0 |
| n9 | 0 | 0 | 1 | 0 | 1 | 0 | 0 | 1 | 1 | 0 |
| n10 | 0 | 0 | 1 | 1 | 0 | 0 | 0 | 1 | 1 | 0 |
| n11 | 0 | 1 | 0 | 1 | 0 | 0 | 0 | 1 | 0 | 1 |
| n12 | 1 | 0 | 0 | 0 | 1 | 0 | 0 | 1 | 0 | 1 |

SELF GENERATIVE PWM VOLTAGE SOURCE INVERTER INDUCTION MOTOR DRIVE

RELATED APPLICATION

This is a continuation-in-part of our co-pending U.S. patent application Ser. No. 262,742, now U.S. Pat. No. 4,400,655, which was filed on May 11, 1981, and which is entitled "Self Generative Variable Speed Induction Motor Drive".

BACKGROUND OF THE INVENTION

The field of the invention is variable speed induction motor drives, and particularly, closed-loop, inverter drives for operating induction motors over a wide speed range under varying load conditions.

The speed of an induction motor is controlled by varying the frequency of the power applied to its stator windings. In order to obtain substantially full-load torque capability at all operating speeds it is also necessary to be able to achieve maximum air-gap flux in the motor. In a voltage-source inverter drive, flux is often held near maximum at all times by maintaining a constant motor voltage-to-motor speed ratio, and in a current-source inverter drive, constant flux can be accomplished by maintaining a functional relation between stator current and motor slip speed. Although such control strategies can be simply stated, their economical implementation and efficiencies for many control applications has to date been lacking.

Numerous closed loop control strategies of varying complexity have been proposed to control induction motors. Most of these require the sensing of motor speed, which in turn requires the use of a shaft speed sensor. Such speed sensors add cost and decrease the reliability of the system, at least in the context of industrial motor drives. More recent strategies such as that described in "Inverter Fed Induction Motor Drive Using Power Factor Control" published in the Journal of the 1976 annual meeting of the IEEE Industry Application Society by S. A. Rosenberg, S. B. Dewan and G. R. Slemon avoid the use of tachometers, but a control strategy which relies solely on power factor control is not desirable. For any given power factor, for example, there are two possible electrical frequencies for any given motor speed and the maintenance of one stable solution is not easy under a wide range of operating conditions. Indeed, it is often desirable to operate a motor at or near a maximum power factor point which would not be desirable as a power factor control circuit set point. This is because circuit component values which are out of tolerance could cause unrealizable power factor requirements which may result in an undesirable high slip frequency operation with consequent poor efficiency and torque capability.

SUMMARY OF THE INVENTION

The present invention relates to an induction motor drive system which controls motor flux at various operating points by controlling the phase relationship of the applied current and motor voltage. This is accomplished in part by a pulse width modulated (PWM) voltage source inverter which is utilized in a current feedback loop to control the a.c. current to the motor, a circuit which multiplexes signals related to the motor terminal voltages and applies the resulting signal to a comparator, and a circuit which advances the phase of alternating current command wave forms applied to the pulse width modulated inverter current control loops. The frequency of the pulse width modulated inverter's current command wave forms is thus self generated from the inverter's output voltage and electronic control of the comparator reference level provides high speed electronic control of the power factor of the system.

A general object of the invention is to enable any of a number of flux control strategies to be easily implemented using a PWM voltage source inverter. For example, to improve motor efficiency, it is usually desirable to reduce the flux level when torque loads are low and dynamic response can be sacrificed. The facility for controlling the power factor, or angle, of the system enables the motor flux operating point to be controlled by varying the comparator reference level with an amplified flux error signal. The error signal may be the difference between a flux command signal and a measured term related to motor flux. The command signal is made equal to a constant ($\phi$o) plus a term proportional to motor current magnitude (KI). The constants $\phi$o and K may be selected to provide constant flux operation (K=0) or constant slip operation ($\phi$o=0) or any combination of the two. Use of a non zero K creates a component of motor flux which is proportional to motor current and which lowers flux during light torque loads to improve efficiency.

Another general object of the invention is to provide a closed loop, variable speed, induction motor drive system which has maximum torque capability up to base speed without the use of tachometers or other devices for measuring slip frequency. In addition, the use of counters, voltage controlled oscillators and dividers normally associated with other power factor or phase control implementations is avoided by using voltage signal feedback from the motor windings to derive the alternating current command wave forms, which together with the current feedback, controls the PWM voltage source inverter, and hence, the excitation frequency and motor speed.

Another object of the invention is to indirectly control the power factor under varying operating conditions and without the disadvantages associated with an open loop commanded power factor control strategy. Instead of directly controlling power factor, the commanded flux may be made proportional to motor current to indirectly control power factor such that only one value of positive slip can exist for a given motor flux. The double valued solution with open loop direct power factor control is thus avoided. This control strategy also provides improved operating efficiencies for variable speed induction motor drive systems by reducing the flux level when low output torques are required.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

BRIEF DESCRIPTION OF THE DRAWINGS

FIGS. 5 and 6 are current wave shapes for alternative embodiments of the invention;

FIG. 7 is a chart of the logic state output of a logic array which forms part of the circuit of FIG. 4.

DESCRIPTION OF THE PREFERRED EMBODIMENT

Figure 1:
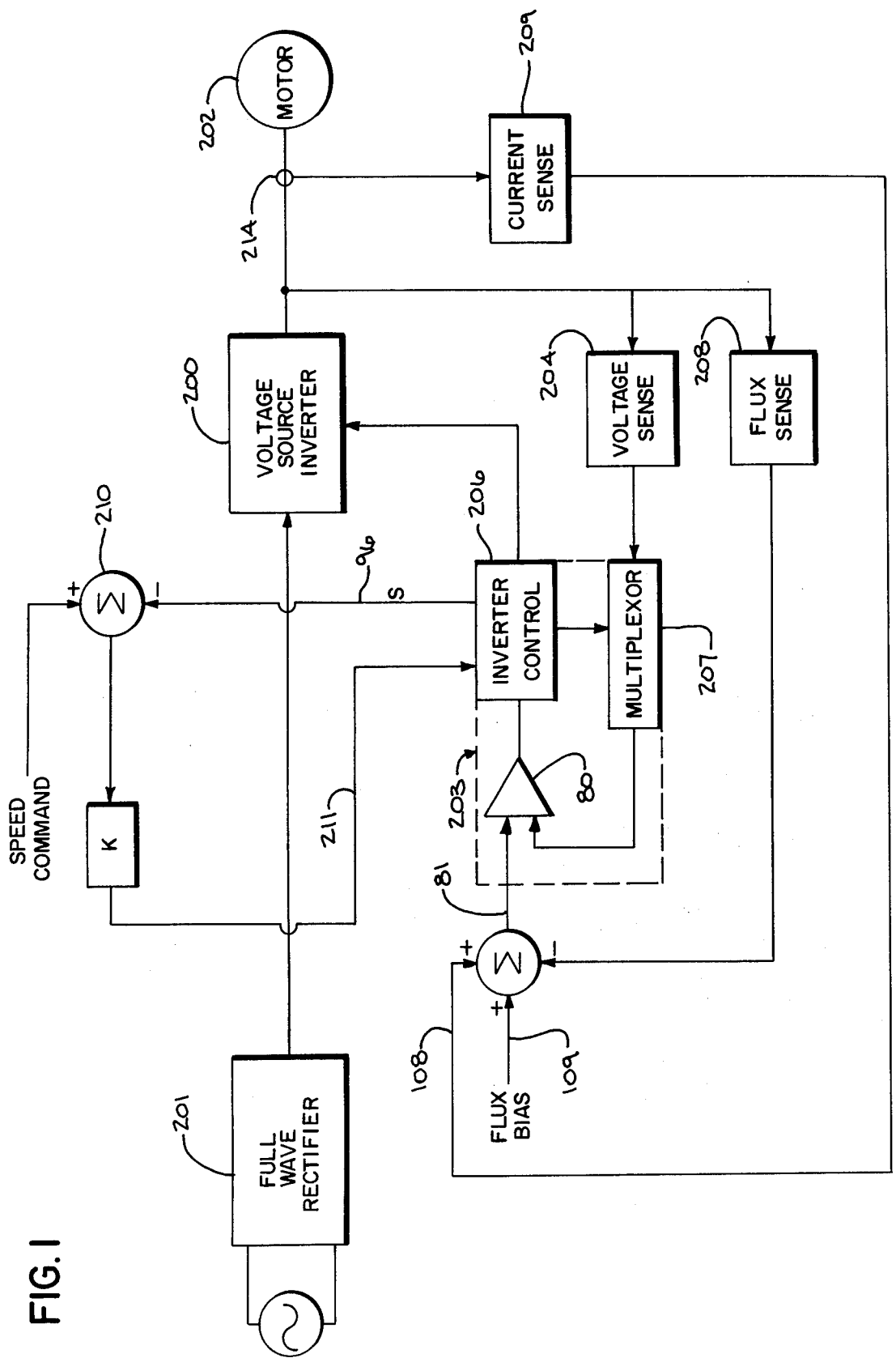
FIG. 1 is a block diagram of the motor drive system of the present invention.

Referring to FIG. 1, a pulse-width modulated, controlled current voltage source inverter 200 inverts the d.c. voltage supplied from voltage source 201 to a three phase set of a.c. voltages and applies them to the induction motor 202. The voltage source inverter 200 also includes circuitry for sensing the motor currents and employing them to provide feedback control of the individual motor phase currents. More specifically, the inverter 200 controls motor current by respectively substracting these motor current feedback signals from the quasi sinusoidal current command wave forms received from the power factor control circuit 203, to produce error signals which in turn offset the inverter. The inverter 200 controls motor current amplitude and frequency using pulse width modulation as will be described in more detail below.

A power factor control circuit 203 generates the alternating current command wave forms that are applied to the voltage source inverter 200. The frequency and phase of these command wave forms is determined by a number of signals input to the circuit 203, including terms related to motor stator winding voltages from the voltage sense circuit 204. Indeed, these cyclic motor voltage signals serve as the primary means for advancing the phase of the alternating current command wave forms and the system is thus self regenerative and does not require separate voltage controlled oscillators, counters or dividers.

The power factor control circuit 203 includes a comparator 80 and an inverter control 206 which operate to discretely advance the phase of the alternating current command wave forms each time the term relating to cyclic stator winding feedback voltage reaches the commanded reference level. A multiplexer 207 sequences signals relating to the three line-to-line stator winding feedback voltages and applies them to one input of a single comparator 80. The reference level applied to the other input of the comparator 80 serves as a means for altering the power factor.

The power factor or angle between voltage and current is altered to control the motor flux. For example, at any constant motor stator current level, increasing the angle would cause more flux at any operating speed. A signal proportional to motor flux magnitude is generated by a flux sense circuit 208 and this is subtracted from a signal proportional to motor current magnitude which is generated by circuit 209. A flux bias signal 109 may also be added to allow a finite motor stator current to exist even at light loads.

Referring still to FIG 1, a speed control loop is established by deriving a speed signal from the phase advance command pulses generated by the power factor control circuit 203. No tachometers or other mechanical devices are required. The speed signal is subtracted from a speed command signal at summing point 210 and the resulting signal is applied to the inverter control 206 through line 211 to control the amount of current applied to the motor 202 by the pulse width modulated voltage source inverter 200.

Numerous current, voltage and flux sense circuits are known in the art and although a preferred embodiment of these circuits is described herein, it should be apparent to those skilled in the art that alternatives are possible. Also, the multiplexer 207 described herein is a unique circuit which enables signals related to the polyphase stator winding voltages to be applied to the single comparator 80. Alternative, but less desirable, arrangements are also possible.

Figure 4:
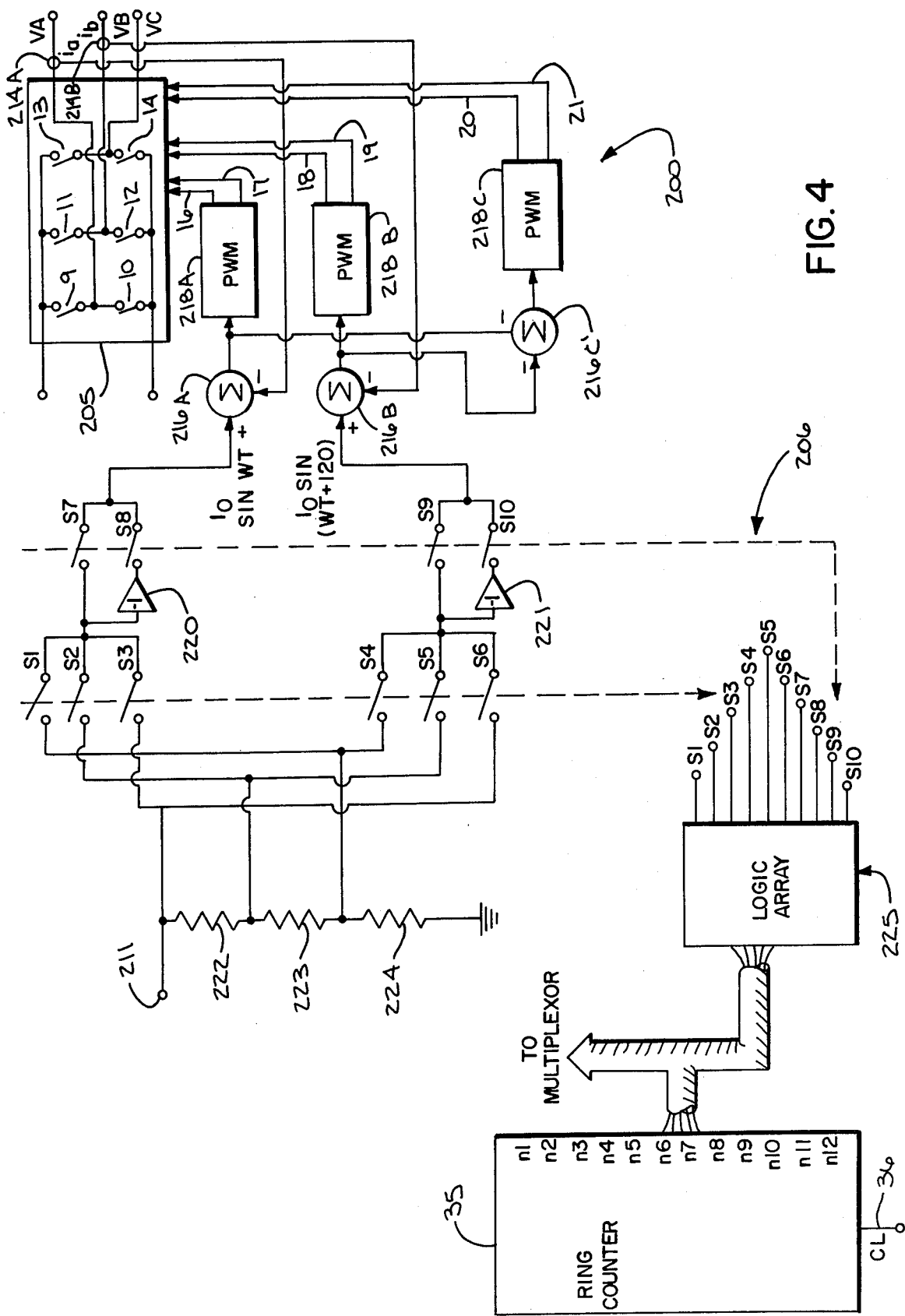
FIG. 4 is an electrical schematic diagram of yet another portion of the motor control circuit of FIG. 1.

Referring to FIG. 4, the voltage source inverter 200 includes a power section 205 comprised of six electronic switches 9–14. The d.c. source voltage is applied to the power input of the power section 205 and its three output terminals connect to respective motor stator terminals VA, VB and VC. The switches 9–14 are opened and closed by signals applied through control lines 16–21 to control the currents (ia, ib, ic) in the motor stator windings. As will be described in more detail below, the stator currents ia and ib are fed back and compared with current command signals $I_o \sin \omega t$ and $I_o \sin (\omega t + 120)$ to produce current error signals. These error signals are applied to pulse width modulator circuits 218A–218C which generate the control signals for the power section 205.

The motor currents (ia, ib, ic) are sensed and employed to provide feedback control of the individual phase currents. More specifically, the error (current) signals generated by respectively subtracting these feedback currents from the alternating current command wave forms are used as the inputs to a pulse width, hysteresis or other type of modulator circuit that controls each phase of the voltage source inverter.

The instantaneous electric current ia flowing into terminal VA (and out through the other terminals VB and VC) is monitored by a current sensor 214A, fed back and subtracted in analog summing circuit 216A from the alternating current command wave form ($I_o \sin \omega t$). $I_o$ represents the commanded stator current amplitude and $\omega$ represents the commanded stator excitation frequency. Desired stator current amplitude and frequency are identical for all three phases. The desired phase relationship is 0°, 120° and 240°. For the first phase, phase A, the phase term in the input command is defined as 0°. The instantaneous current difference or error signal, $i_{ERROR\ A} = I_o \sin \omega t - i_a$, provided by circuit 216A is used to control a two state modulator 218A, which in effect converts the analog current error signal to a two state (binary) signal. This is accomplished preferably by pulse width modulation through which the varying amplitude content of the current error signal is synthesized by varying the duty cycle of the output such that its average value is proportional to the error signal. The output of the modulator 218A operates the semiconductor voltage switches 9 and 10. When the output of the modulator 218A is high, terminal VA is connected to positive d.c. voltage. When the output of the modulator 218A is low, terminal VA is connected to negative d.c. voltage.

To enhance performance, the error signal can be amplified and frequency compensated with standard loop compensation techniques ($K(s)$) before feeding the Pulse width modulators.

While the voltage applied to the terminal VA is either of two fixed levels, the reactance of the stator windings in combination with harmonic cancellation from the other phases smooths the current into the desired quasi-sinusoidal wave form. It is this wave form which is directly sensed by sensor 214A and compared to the input command in the current feedback loop A to drive the modulator 218A. The effect of the feedback loop is to force the wave form and amplitude of the current flowing into terminal VA to closely approximate the alternating current command wave form.

The phase B terminal is driven by a similar network including switches 11 and 12, sensor 214B, summing circuit 216B and modulator 218B. With this configuration, terminal VB is connected to the junction of the electronic switches 11 and 12 operated by module 218B. The current into terminal VB is directly sensed by sensor 214B as in the phase A network. The current $i_b$ is subtracted from the input command for phase B, $I_o \sin(\omega t + 120°)$, which differs only in phase from the command for phase A. Current feed back loop B operates similarly to loop A.

The phase C terminal may be driven in an analogous fashion by switches 13 and 14, however, as described in U.S. Pat. No. 4,306,182 which is incorporated herein by reference, due to the Kirchoff current constraint, it is more advantageous to omit the current feedback loop C and reference command $I_o \sin(\omega t + 240°)$ altogether. As shown in the preferred system of FIG. 4, an analog summing circuit 216C creates the negative sum of the PWM commands for phases A and B which automatically provides the correct command for modulator 218C and produces an inherently balanced excitation system in both voltage and current.

The inverter control circuit 206 generates the alternating current command wave forms. One method for creating the discrete, phase shifted, but amplitude controllable, multiphase alternating current command signals ($I_o \sin \omega t$ and $I_o \sin(\omega t + 120)$ is to sequentially switch among a set of attenuated versions of the variable stator current amplitude command. The attenuator ratios and switching sequence is selected to create discrete level, "box car" type approximations to the multiphase sinewaves. The boxcar type sinusoidal approximations have relative discrete amplitude levels corresponding to sample and hold versions of equal amplitude 120 degree phase displaced sinusoidal waveshapes. Through judicious use of symmetry and the use of inverting amplifiers, it is possible to minimize the number of discrete amplitude levels and thus the number of attenuators required.

For example, in a design where discrete phase advances are selected to occur every 60 degrees and applying symmetry to minimize the number of levels, one of the synthesized current command waveshapes ($I_o \sin \omega t$) would appear as in FIG. 5. In this situation no attenuators are required. The waveshape for the current command with this constraint comes out identical to what the standard current source inverter generates.

For the situation where discrete phase advances are selected to occur every 30 degrees and proper use of symmetry is employed, only 2 attenuators are needed and two waveshapes which meet this requirement are superimposed in FIG. 6. In the preferred embodiment of the invention the circuit for generating such current command signals ($I_o \sin \omega t$ and $I_o \sin(\omega t + 120)$ is shown in FIG. 4. Ten transistor switches S1–S10 are connected in a network with a pair of inverting amplifiers 220 and 221. The stator current amplitude command on control line 211 is the input to this network and three separate levels of this input signal are provided by attenuators formed with resistors 222, 223 and 224. The control element on switches S1 through S10 are connected to the outputs of a logic array 225 and when a logic "1" is generated at an output of the array 225, the corresponding switch S1–S10 is closed.

Referring still to FIG. 4, the logic array 225 is driven by a 12-bit ring counter 35 which circulates a logic "1" through its twelve outputs n1–n12 in response to phase advance command pulses received through a CL control line 36. FIG. 7 is a table of the condition of each switch S1–S10 as the ring counter 35 is advanced through its twelve states n1–n12 to produce the twelve-step alternating current command wave form of FIG. 6. Thus, each phase advance command pulse CL advances the phase of the current command wave form.

Figure 2:
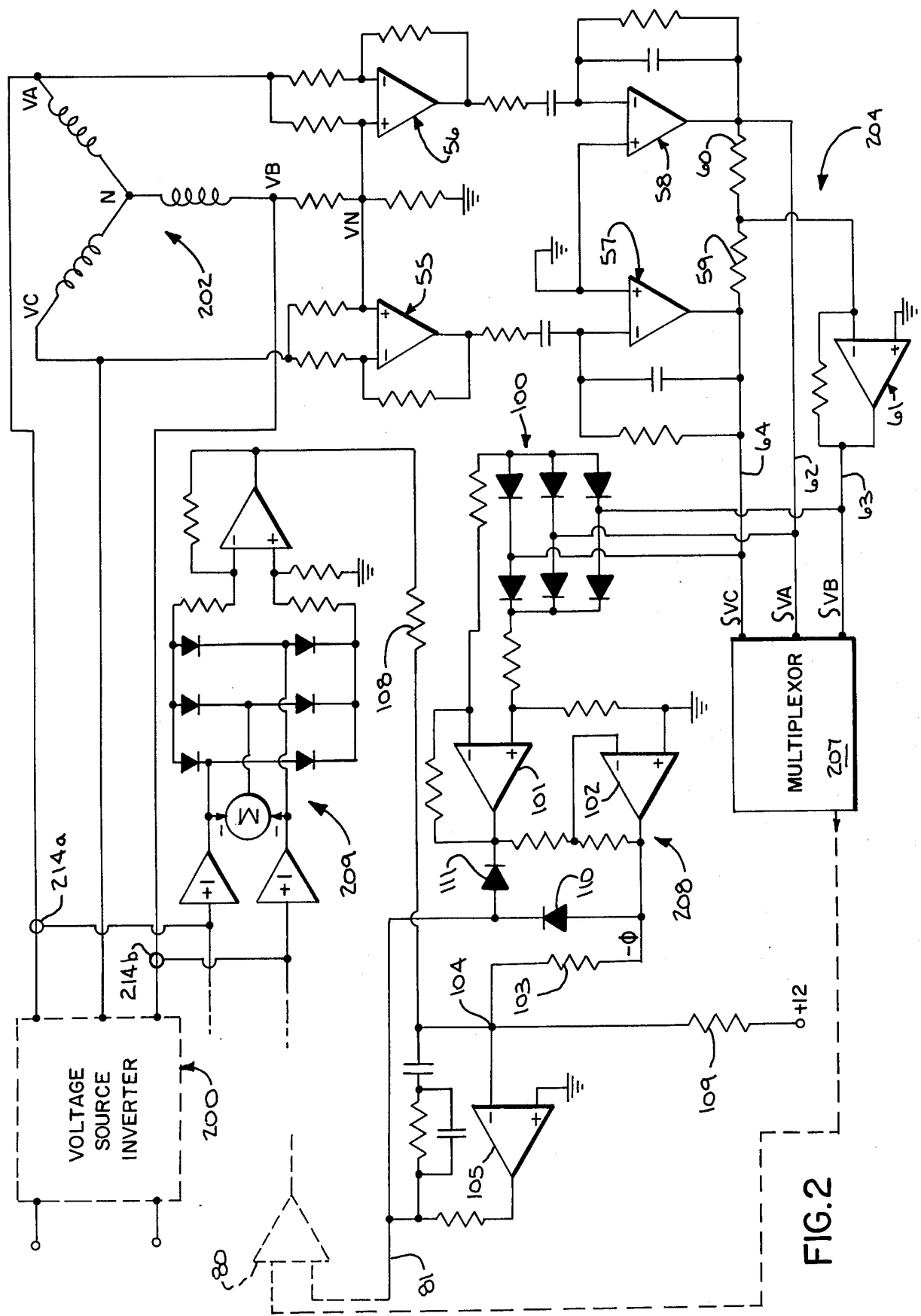
FIG. 2 is an electrical schematic diagram of a portion of the motor control circuit of FIG. 1.

The frequency of the pulses CL is determined by the power factor control circuit 203 which receives feedback information from the motor 202. Referring particularly to FIG. 2, the voltage wave forms at the stator winding terminals VA, VB and VC are applied to a pair of operational amplifiers 55 and 56 and are then integrated by circuits which include operational amplifiers 57 and 58. The voltage wave form at terminal VB is actually summed with the other two wave forms VA and VC to create an artificial neutral, and thus the integrators 57 and 58 are operating on the line to neutral voltages. The integral of wave form VB is artificially obtained by inverting the sum of the outputs of the integrators 57 and 58 using a pair of resistors 59 and 60 and an operational amplifier 61. The integral of the voltage wave forms VA, VB and VC are thus generated and applied as feedback signals to the multiplexor circuit 207 through respective control lines 62, 63 and 64. It should be apparent that numerous circuits for sensing and smoothing the voltage wave forms VA, VB and VC may be employed in place of that disclosed herein. The integration step is preferable, however, because it does smooth the otherwise "corrupted" voltage wave forms and the resulting ninety degree phase shift can be easily accounted for in subsequent circuitry.

Integration of the terminal voltages in a three phase system creates sinusoidal type waveshapes at 120° angles to each other, which together with the negatives of these waveshapes creates a set of six sinewaves at every 60°. Additional sinewaves phased equidistant between these signals are easily created for example by summing each adjacent pair and applying a weighting factor of $1/\sqrt{3}$ to achieve equal amplitudes. This results in a set of twelve sinewave segments equidistantly phased. In an analogous manner, any set in the sequence 6, 12, 24, 48 . . . could be created using this technique. An analogous procedure can also apply to 2 phase systems wherein the sequence 4, 8, 16, 32 . . . is easily created.

Figure 3:
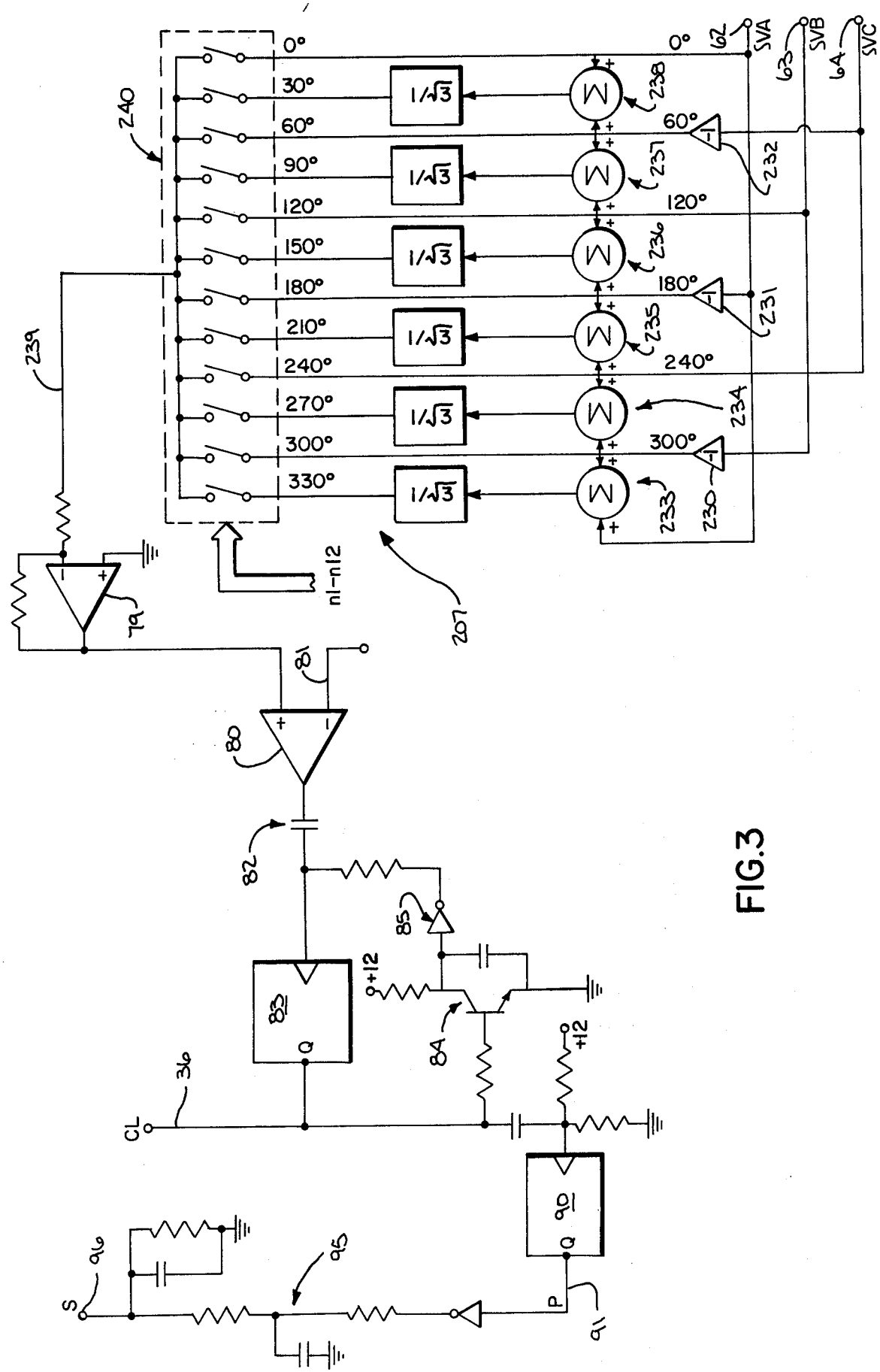
FIG. 3 is an electrical schematic diagram of another portion of the motor control circuit of FIG. 2.

Referring particularly to FIG. 3, twelve equidistantly-phased sinewaves are generated from the three motor terminal voltages by a network of three inverting amplifiers 230–232 and six summing amplifiers 233–238. The summing amplifiers 233–238 have a gain of $1/\sqrt{3}$ to provide equal amplitude sinewaves. The twelve cyclic feedback signals thus produced have substantially equal amplitude and are equidistantly phased with respect to each other.

The twelve cyclic feedback signals are multiplexed onto a single line 239 by a set of twelve transistor switches 240. In this line-to-neutral configuration the twelve switches 240 are sequentially operated by the logic level signals at the ring counter outputs n1-n12. As each phase advance command pulse CL is generated, the ring counter 35 is advanced one step and the next one of the twelve multiplexer switches 240 is closed. The twelve switches 240 are thus successively closed to sequentially apply the twelve equidistantly phased sinewaves to the line 239. It should be apparent that the driving signals n1-n12 for the multiplexer 207 can be connected to the switches 240 to provide any desired nominal phase relationship between the cyclic feedback signals and the alternating current command wave forms. Typically this relationship is chosen so that the comparator reference command is near zero to obtain the sharpest comparisons.

The output of the multiplexer 207 is coupled through an operational amplifier 79 to one input of an operational amplifier 80 which operates to compare the magnitude of the multiplexed cyclic wave form with a composite reference voltage on a line 81. When the multiplexed wave form goes below the composite reference voltage, the output of amplifier 80 swings negative and it generates a voltage pulse through a capacitor 82 to the trigger input of a monostable multivibrator 83. The monostable multivibrator 83 produces a phase advance command pulse on the CL control line 36 each time such a voltage pulse is applied to its input to sequence the ring counter 35 and to thus self generate a frequency proportional to the fundamental of motor excitation. The level appearing on line 81 controls the angle between current and voltage and it thus determines the shape of the multiplexed wave form. Unlike prior systems, there is no need for a separate voltage-controlled oscillator with associated counters or dividers since the operation of the motor voltages serve to provide the cyclic feedback signals used to control the PWM inverter circuit 200. A resetable low frequency oscillator is formed by an RC network at the collector of transistor 84 and inverter gate 85. The gate operates as a threshold detector which triggers the monostable multivibrator 83 which in turn resets the RC network via transistor 84. The system is thus "seeded" with low frequency pulses during start up. When the pulse rate from the comparator 80 exceeds that produced by the low frequency oscillator, the latter is effectively removed from the circuit.

The phase advance command pulses CL generated by the monostable multivibrator 82 are also employed to derive the speed feedback signal S. Referring particularly to FIG. 3, the pulses CL are applied to the trigger input of a second monostable multivibrator 90 which generates pulses P on a line 91. The pulses P generated by the monostable multivibrator 90 are "constant area" pulses which are employed to produce the analog speed feedback signal S. As shown in FIG. 1, this signal (S) is applied to the summing point 210 to close the speed control loop. Referring again to FIG. 3, the signal S is generated by a filter network 95 comprised of a pair of resistor-capacitor filters. The resulting speed feedback signal S has a magnitude which is proportional to the rate at which the pulses P are generated, and hence to the stator voltage frequency. Since slip frequency is usually small and reasonably constant if flux is made proportional to stator current, feedback signal S can provide an accurate indication of mechanical frequency. As shown in FIG. 1, the speed feedback signal S is coupled through the control line 96 to the summing point 210 to close the speed control loop.

Referring particularly to FIG. 3, the timing of the pulse generated by the comparator 80, and hence the frequency of the resulting pulse train, is determined by the magnitude of the reference signal on the line 81. This reference signal provides a means for varying the power factor at which the motor 202 operates and it also provides the means for implementing a control strategy. The control strategy of the preferred embodiment of the invention is to make motor flux equal to a constant plus a term proportional to motor current. This is achieved by varying the power factor at which the motor operates through the control line 81. If the flux bias ($\phi o$) is set near zero, the power factor also tends to remain constant over varying loads.

Referring particularly to FIG. 2, to implement this strategy a signal proportional to motor air gap flux is obtained by rectifying and summing the three integrated stator voltage wave forms VA, VB and VC. This is accomplished by a full wave bridge rectifier circuit 100 which connects to the respective control lines 62-64 and which drives a pair of operational amplifiers 101 and 102. The amplifier 101 operates as a voltage divider to reduce the magnitude of the resulting flux signal and the amplifier 102 operates as an inverter having a gain of one. The resulting flux signal ($-\phi$) is coupled through a resistor 103 to a summing point 104 at the input of an operational amplifier 105.

The flux signal ($-\phi$) is also summed with a signal proportional to motor stator current and the resulting error signal is nulled by amplifier 105. The stator current signal is generated by a full wave bridge rectifier circuit 209 which has its inputs connected to sense the motor stator currents $i_a$ and $i_b$. In some applications, direct measurement of the stator amplitudes is not required as the amplitude command signal is adequate and can be used instead. A resistor 108 connects the output of the rectifier circuit 209 to the summing point 104. In addition, a resistor 109 connects the summing point 104 to a d.c. supply terminal to enable a bias flux signal to be injected. This bias flux signal effectively provides a minimum flux at low torque levels to enhance dynamics.

The desired flux is maintained under varying speed and load requirements by controlling the power factor at which the motor 202 is operated. When the flux is less than the commanded amount, the composite reference signal to the comparator 80 is reduced by the amplifier 105. This delays the generation of phase advance command pulses CL to thereby instantaneously decrease the power factor. For any given stator current amplitude, this results in an increase in air gap flux. On the other hand, if the flux is greater than the commanded amount, the composite reference signal on line 81 increases. This advances the generation of phase advance command pulses CL to reduce the reactive current for any given stator current amplitude and will thus reduce motor flux.

The reference signal output of the amplifier 105 must not exceed the peak level of the cyclic wave form applied to the comparator 80 by the multiplexer 207. This is insured by a pair of clamping diodes 110 and 111 which connect the control line 81 to the outputs of amplifiers 101 and 102. The diodes limit the voltage on line 81 to a value less than the peak value of the integrated stator voltage wave forms which appear at the input to amplifier 101.

It should be apparent that the reference signal applied to the comparator 80 may include other components which enable the system to implement numerous control strategies. It has been found, however, that the motor current component is particularly useful in maximizing efficiency under a wide variety of operating conditions.

In the preferred embodiment of the invention, a multiplexer and a single comparator are employed to create signals for discretely incrementing the stator phase. As should be obvious to one skilled in the art, multiple comparators could also be used in place of the single comparator to avoid the use of multiplexing. In this multiple comparator version, the variable reference level would feed one terminal of all the comparators and suitable circuitry would be incorporated to sequence to the next discrete stator phase position when any comparator senses a unidirectional threshold crossing. With the multiple comparator configuration, hysteresis (possibly time variable) or another masking technique should be included to avoid multiple comparator crossings due to noise.

Figure 8:
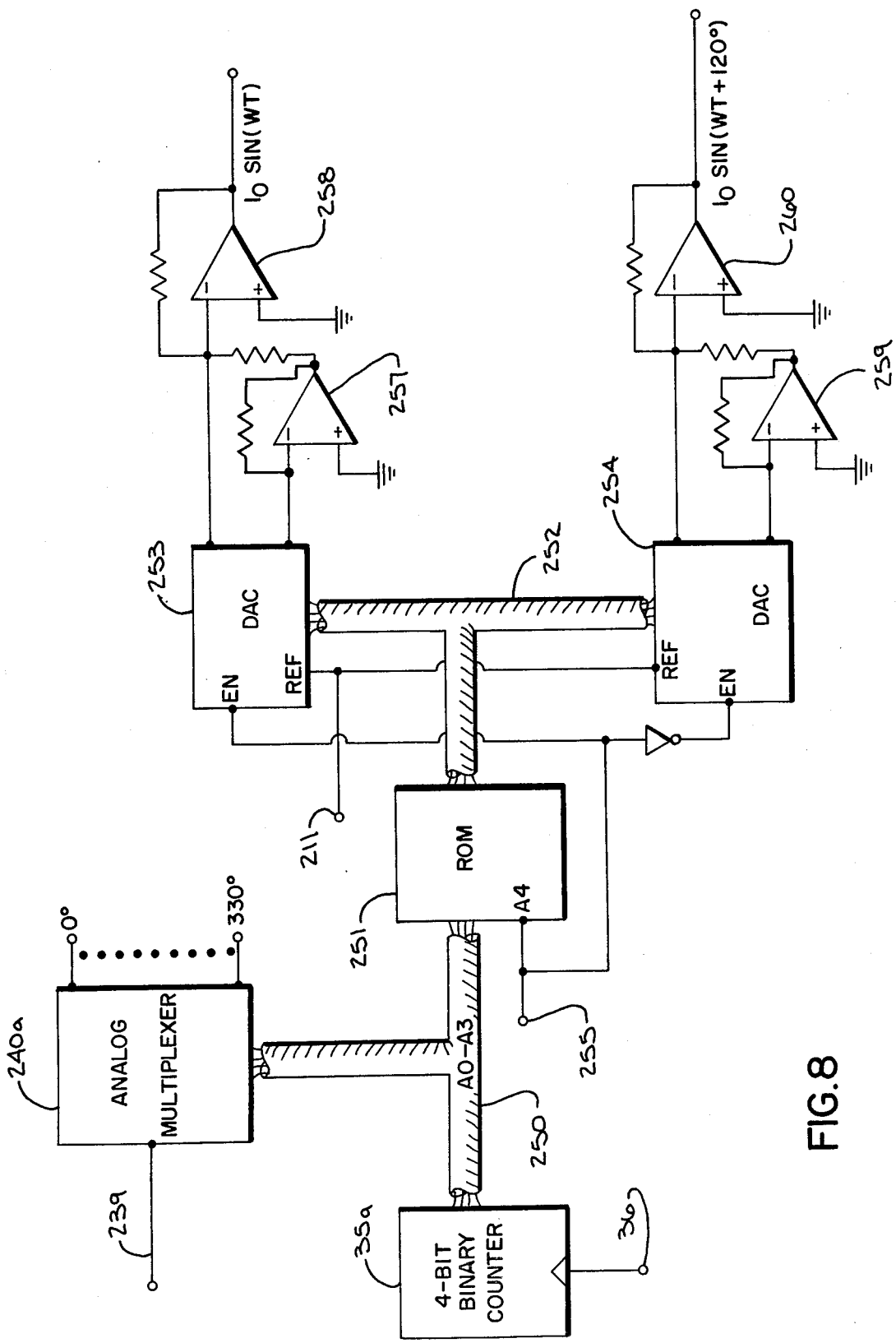
FIG. 8 is an electrical schematic diagram of an alternative embodiment of the circuit of FIG. 4.

An alternative to the circuit of FIG. 4 is shown in FIG. 8. In this alternative embodiment the 12-bit ring counter 35 is replaced with a 4-bit binary counter 35a configured to count through twelve states and the analog switches 240 (FIG. 3) are replaced by two 8-bit analog multiplexers which are indicated collectively at 240a. The counter 35a is incremented by the phase advance command pulses CL on the line 36 to generate a 4-bit binary number on a bus 250. This 4-bit number on the bus 250 is applied to the analog multiplexer 240a to select one of the twelve cyclic feedback signals (0°, 30°, 60°, 90° ... 330°). The selected feedback signal is applied to the comparator through control line 239 (FIG. 3) as described above.

The same 4-bit number is applied to the address terminals A0-A3 on a read-only memory (ROM) 251. The ROM 251 produces two sets of binary outputs on a data bus 252 which are used as inputs to two 8-bit digital-to-analog converters (DAC) 253 and 254. The ROM 251 is programmed so that as the counter 35a steps through its complete twelve-step cycle, the outputs from the ROM 251 produce a digital signal which when converted into voltage levels by the DACs 253 and 254 are boxcar approximations to sine waves. One set of numbers stored in the ROM 251 correspond to a sine wave and the other set correspond to a sine wave which is phase displaced 120 degrees. A fifth address terminal A4 on the ROM 251 selects which set of numbers is output from the ROM 251. This is driven by a high speed clock line 255 which also drives the data enable terminals on the DACs 253 and 254. Thus, during each step of the binary counter 35a, a digital number corresponding to the boxcar approximation of the amplitude of a sine wave is output from the ROM 251 and applied to the DAC 253, and a digital number corresponding to the boxcar approximation of the amplitude of a 120 degree phase-displaced sine wave is applied to the DAC 254. When the binary counter 35a cycles through its twelve steps, a complete cycle of each boxcar approximated sine wave is generated.

The digital-to-analog converters 253 and 254 are double buffered converters such as the model DAC0832 manufactured by National Semiconductor, Inc. The DACs 253 and 254 each generate an analog signal which is proportional in magnitude to the digital number which is input from the bus 252 multiplied by the level of an analog signal applied to a reference input (Ref). The analog output of the DAC 253 is applied to a pair of operational amplifiers 257 and 258 which generate the Phase A reference command signal $I_o \sin(\omega t)$, and the output of DAC 254 is applied to a pair of operational amplifiers 259 and 260 which generate the Phase B signal $I_o \sin(\omega t + 120)$. The "Ref" input on each DAC 253 and 254 is driven by the current control line 211 (FIG. 1) and the magnitude of the signal on the control line 211 determines the value of $I_o$ in the respective reference command signals.

We claim:
1. An induction motor drive which comprises:
a PWM voltage source inverter fed by a fixed d.c. voltage;
stator winding current control means including means for sensing the current flowing in the motor stator windings, means for generating current error signals proportional to the difference between the sensed stator winding currents and a set of alternating current command wave forms and means for effecting the voltage source inverter in response to said current error signals to provide control of the motor stator winding currents;
voltage sensing means coupled to the motor stator windings and being operable to generate a set of cyclic feedback signals related in both frequency and phase to the fundamental of the motor stator winding voltages;
power factor control means connected to receive said cyclic feedback signals and being operable in response thereto to generate the alternating current command wave forms to said stator winding current control means, the power factor control means being operable to control the phase of the alternating current command wave forms relative to the motor stator winding voltages to thereby maintain the power factor of the electric power applied to the induction motor at a commanded level and including inverter control means which is operable in response to a stator current amplitude command to control the amplitude of the alternating current command wave forms;
means coupled to the induction motor for generating a power factor command to the power factor control means which reflects the magnetic flux error from which the induction motor is to operate; and
input means coupled to the inverter control means for generating a stator current amplitude command.

2. The induction motor drive as recited in claim 1 in which said voltage sensing means includes integrator means for integrating the stator winding voltages and producing substantially sinusoidal cyclic feedback signals related to the fundamental of the stator voltages by a fixed phase shift.

3. The induction motor drive as recited in claim 1 in which the power factor control means includes:
summing network means connected to the voltage sensing means to receive the set of cyclic feedback signals and being operable to generate a larger set of equidistantly phased cyclic feedback signals by summing and weighting adjacent pairs of input cyclic feedback signals and their inverses;
comparator means connected to receive both the equidistantly phased cyclic feedback signals and the power factor command and being operable to generate phase advance command pulses that discretely advance the phase of the alternating current command wave forms; and analog phase shifting means connected to receive the equidistantly phased cyclic feedback signals and the power factor command signal, and being operable to generate phase advance command pulses that are phase shifted relative to the zero-cross points of the equidistantly phased cyclic feedback signals by an amount related to the level of the power factor command signal.

4. The induction motor drive as recited in claim 3 in which the power factor control means also includes:
multiplexer means for successively gating the set of equidistantly phased cyclic feedback signals to a comparator in synchronism with the discrete phase advances of the alternating current command wave forms, such that the comparator generates phase advance command pulses whenever the magnitude of the multiplexed wave form is equal to the magnitude of the power factor command signal.

5. The induction motor drive as recited in claim 3 in which said inverter control means includes:
attenuator and inverting amplifier means connected to receive the stator current amplitude command and being operable to generate a set of attenuated and inverted versions of said stator current amplitude command; and
means for switching among the set of attenuated and inverted stator current amplitude commands in synchronism with the phase advance command pulses generated by the comparator means in order to produce said alternating current command wave forms.

6. The induction motor drive as recited in claim 1 in which the power factor control means also includes:
low frequency oscillator means being operable to advance the phase of the alternating current command wave forms whenever the cyclic feedback signals drop below a preselected frequency.

7. The induction motor drive as recited in claim 6 in which the fixed low frequency oscillator means includes a resetable multivibrator connected to receive the phase advance command pulses from the comparator means and being operable to generate supplemental phase advance command pulses at a fixed low frequency whenever the input pulses are below said fixed low frequency.

8. The induction motor drive as recited in claim 1 in which the means for generating a power factor command includes:
means coupled to the induction motor for sensing the magnitude of the magnetic flux in the induction motor;
means for determining the magnitude of the induction motor stator winding current; and
means responsive to the difference of the sensed magnetic flux magnitude and the sensed stator winding current magnitude for generating said power factor command signal, such that the motor flux is controlled as a function of the stator winding current magnitude.

9. The induction motor drive as recited in claim 8 in which said means for sensing the magnitude of the magnetic flux in the induction motor includes means for sensing each motor stator winding voltage, means for integrating the sensed motor stator winding voltages, and means for rectifying and summing the integrated motor stator winding voltages.

10. The induction motor drive as recited in claim 8 in which said means for determining the magnitude of the motor stator winding current includes means for sensing each motor stator winding current and means for rectifying and summing the sensed stator winding currents.

11. The induction motor drive as recited in claim 8 in which said means for determining the magnitude of the motor stator winding current is coupled to receive and utilize the stator current amplitude command.

12. The induction motor drive as recited in claim 1 in which the input means includes:
means for generating a speed command signal;
means for sensing the motor electrical frequency and generating a speed feedback signal indicative of motor speed; and
means responsive to the difference between the speed command signal and the speed feedback signal for generating said stator current amplitude command.

13. The induction motor drive as recited in claim 12 in which the power factor control means includes comparator means coupled to receive the cyclic feedback signals and the power factor command and being operable to generate phase advance command pulses that discretely advance the phase of the alternating current command wave forms; and
said means for sensing the motor electrical frequency includes means connected to the comparator means which produces a signal proportional to the rate at which the phase advance command pulses are generated.

14. The induction motor drive as recited in claim 3 in which said inverter control means includes:
memory means for storing in digital form an alternating wave form;
counter means connected to receive the phase advance command pulses and connected to the memory means for reading out digital numbers indicative of the phase of the alternating current command wave form; and
digital to analog converter means connected to receive the digital numbers read from the memory means and connected to receive the stator current amplitude command, the digital to analog converter means being operable to generate current command wave forms have a phase determined by the received digital numbers and an amplitude determined by the stator current amplitude command.

* * * * *